United States Patent
Mathew et al.

(10) Patent No.: US 7,504,302 B2
(45) Date of Patent: Mar. 17, 2009

(54) PROCESS OF FORMING A NON-VOLATILE MEMORY CELL INCLUDING A CAPACITOR STRUCTURE

(75) Inventors: Leo Mathew, Austin, TX (US); Ramachandran Muralidhar, Austin, TX (US); Tab A. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 458 days.

(21) Appl. No.: 11/083,878

(22) Filed: Mar. 18, 2005

(65) Prior Publication Data

US 2006/0220102 A1    Oct. 5, 2006

(51) Int. Cl.
   *H01L 21/336*    (2006.01)
   *H01L 21/20*    (2006.01)

(52) U.S. Cl. ............... 438/257; 438/393; 257/E21.209

(58) Field of Classification Search ............... 438/257, 438/393

See application file for complete search history.

(56) References Cited

U.S. PATENT DOCUMENTS 5,179,427 A * 1/1993 Nakayama et al. .......... 257/211
5,574,299 A * 11/1996 Kim ............................ 257/296
5,990,509 A * 11/1999 Burns et al. ................. 257/296
6,657,252 B2 * 12/2003 Fried et al. .................. 257/316
6,686,245 B1   2/2004 Mathew et al.
6,753,216 B2   6/2004 Mathew et al.
6,831,310 B1   12/2004 Mathew et al.
6,838,322 B2   1/2005 Pham et al.
7,018,876 B2 * 3/2006 Mathew et al. .............. 438/151
2003/0178670 A1 9/2003 Fried
2005/0101072 A1 5/2005 Bryant et al.

OTHER PUBLICATIONS

U.S. Appl. No. 10/871,772, filed Jun. 18, 2004.

* cited by examiner

*Primary Examiner*—Howard Weiss (57) ABSTRACT

A non-volatile memory cell can include a substrate, an active region overlying the substrate, and a capacitor structure overlying the substrate. From a plan view, the capacitor structure surrounds the active region. In one embodiment, the non-volatile memory cell includes a floating gate electrode and a control gate electrode. The capacitor structure comprises a first capacitor portion, and the first capacitor portion comprises a first capacitor electrode and a second capacitor electrode. The first capacitor electrode is electrically connected to the floating gate electrode, and the second capacitor electrode is electrically connected to the control gate electrode. A process for forming the non-volatile memory cell can include forming an active region over a substrate, and forming a capacitor structure over the substrate, wherein from a plan view, the capacitor structure surrounds the active region.

20 Claims, 7 Drawing Sheets

PROCESS OF FORMING A NON-VOLATILE MEMORY CELL INCLUDING A CAPACITOR STRUCTURE

BACKGROUND

1. Field of the Disclosure

The present disclosure relates to non-volatile memory cells and processes for forming them, and more particularly to non-volatile memory cells including capacitor structures and processes for forming the same.

2. Description of the Related Art

A conventional non-volatile memory ("NVM") cell includes a control gate electrode and a floating gate electrode. One of the design challenges for NVM cells has been to increase the capacitive coupling between the control gate electrode and the charge storage layer (e.g., a floating gate electrode) without significantly increasing the substrate area occupied by the NVM cell. The coupling ratio is given by the following equation.

$$\alpha_{FC} = C_{FC}/C_{FT} = C_{FC}/(C_{FC} + C_{FS} + C_{FB} + C_{FD}),$$

wherein:

$\alpha_{FC}$ is the coupling ratio;

$C_{FC}$ is the capacitance between the charge storage layer and the control gate electrode;

$C_{FT}$ is the capacitance between the charge storage layer and other parts of the NVM cell;

$C_{FS}$ is the capacitance between the charge storage layer and the source region;

$C_{FB}$ is the capacitance between the charge storage layer and the channel region; and $C_{FD}$ is the capacitance between the charge storage layer and the drain region.

EPROM Tunnel Oxide ("ETOX") NVM cell has a control gate electrode and a floating gate electrode with sides that are substantially coterminous. The coupling ratio for an ETOX NVM cell is approximately 0.5. Floating-gate Electron Tunneling MOS ("FETMOS") NVM cell has a control gate electrode that overlies and laterally surrounds at least part of the floating gate electrode. The area occupied by the floating gate electrode can be about the same as for the ETOX NVM cell. The coupling ratio is approximately 0.6; however, the FETMOS NVM cell is typically larger than an ETOX NVM cell because the control gate electrode extends beyond the sides of the floating gate electrode.

Another design is disclosed in U.S. patent application Ser. No. 10/871,772, entitled "Transistor with Vertical Dielectric Structure" by Matthew et al. filed Jun. 18, 2004, which is assigned to the current assignee hereof. The structure disclosed in the patent application is of a type referred to as a "FinFET" NVM cell. With a conventional FinFET NVM cell, a coupling ratio higher than 0.7 but less than 0.75 may be achieved. While the coupling ratio for the FinFET NVM cell is an improvement over the ETOX and FETMOS NVM cells, a higher coupling ratio without incurring a significant increase in NVM cell area is still desired.

BRIEF DESCRIPTION OF THE DRAWINGS

Embodiments are illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments.

DETAILED DESCRIPTION

A non-volatile memory cell can include a substrate, an active region overlying the substrate, and a capacitor structure overlying the substrate. From a plan view, the capacitor structure surrounds the active region. In one embodiment, the non-volatile memory cell includes a floating gate electrode and a control gate electrode. The capacitor structure comprises a first capacitor portion, and the first capacitor portion comprises a first capacitor electrode and a second capacitor electrode. The first capacitor electrode is electrically connected to the floating gate electrode, and the second capacitor electrode is electrically connected to the control gate electrode. A process for forming the non-volatile memory cell can include forming an active region over a substrate, and forming a capacitor structure over the substrate, wherein from a plan view, the capacitor structure surrounds the active region.

In a first aspect, a non-volatile memory cell can include a substrate, an active region overlying the substrate, and a capacitor structure overlying the substrate. From a plan view, the capacitor structure surrounds the active region.

In one embodiment of the first aspect, the non-volatile memory cell includes a floating gate electrode and a control gate electrode. The capacitor structure can include a first capacitor portion, and the first capacitor portion includes a first capacitor electrode and a second capacitor electrode. The first capacitor electrode can be electrically connected to the floating gate electrode and the second capacitor electrode can be electrically connected to the control gate electrode. In a particular embodiment, the first capacitor portion can include a third capacitor electrode that is electrically connected to the control gate electrode. In another particular embodiment, none of the first capacitor portion overlies the active region. In a more particular embodiment, a highest point of the first capacitor portion can lie at an elevation below a lowest point of the active region.

In still another particular embodiment of the first aspect, the capacitor structure can include a second capacitor portion. A first capacitor electrode of the second capacitor portion can be electrically connected to the first capacitor electrode of the first capacitor portion, and a second capacitor electrode of the second capacitor portion can be electrically connected to the second capacitor electrode of the first capacitor portion. In a more particular embodiment, the first capacitor electrode and floating gate electrode are parts of a first layer. The second capacitor electrode, the third capacitor electrode, and the control gate electrode are parts of a second layer different from the first layer. In another more particular embodiment, the first and second capacitor portions are spaced apart from the active region.

In another embodiment of the first aspect, the non-volatile memory cell can further include an insulating layer lying between the substrate and the active region. In a particular embodiment, the insulating layer includes an oxide.

In a second aspect, a process for forming a non-volatile memory cell can include forming an active region over a substrate and forming a capacitor structure over the substrate. From a plan view, the capacitor structure surrounds the active region.

In one embodiment of the second aspect, forming the capacitor structure can include forming a first layer over the active region, wherein the first layer includes a charge storage layer, and forming a second layer over the first layer, wherein the second layer has a different composition compared to the first layer. Forming the capacitor structure can also include forming a first etch mask over the second layer, wherein exposed portions of the first and second layers overlie the active region and are not covered by the first etch mask, etching part of the exposed portion of the second layer, etching part of the exposed portion of the first layer to leave a residual portion, and removing the first etch mask. Forming the capacitor structure further includes forming a dielectric layer over the residual portion of the first layer, and forming a third layer over the dielectric layer, wherein the third layer includes a control gate layer.

In a particular embodiment of the second aspect, each of forming the first layer and forming the third layer can include depositing a polysilicon layer or an amorphous silicon layer. In a more particular embodiment, forming the second layer can include depositing a nitride layer. In another particular embodiment, a portion of the first layer covered by the first etch mask corresponds to a floating gate electrode for the non-volatile memory cell. In still another particular embodiment, etching part of the exposed portion of the second layer forms a sidewall spacer lying adjacent to the first layer. In a particular embodiment, after etching part of the exposed portion of the first layer, only portions of the first layer covered by the first etch mask and sidewall spacer lie within the non-volatile memory cell.

In yet another particular embodiment of the second aspect, the process can further include forming a second etch mask over the third layer, and etching an exposed portion of the third layer to leave remaining a portion. After etching the exposed portion of the third layer, the remaining portion of the third layer can include a control gate electrode and a capacitor electrode of the capacitor structure.

In still another embodiment of the second aspect, forming the capacitor structure includes forming a first layer over the active region, wherein the first layer comprises a charge storage layer. Forming the capacitor structure also includes forming a second layer over the first layer, wherein the second layer has a different composition compared to the first layer, and etching the second layer for form sidewall spacers. Forming the capacitor structure further includes forming a first etch mask over the first layer, wherein exposed portions of the first layer overlie the active region and are not covered by the first etch mask, etching part of the exposed portion of the first layer to leave a residual portion, removing the first etch mask, and forming a dielectric layer over the residual portion of the first layer. Forming the capacitor structure still further includes forming a third layer over the dielectric layer, wherein the third layer comprises a control gate layer.

In a third aspect, a non-volatile memory cell can include a substrate, an insulating layer overlying the substrate, an active region overlying the insulating layer, wherein sides of the active region and a portion of the insulating layer are substantially coterminous with each other, a gate dielectric layer lying along the active region, and a first layer including polysilicon. The first layer can include a first portion, a second portion, and a third portion. The first portion of the first layer can overlie the gate dielectric layer and a channel region within the active region, the second portion of the first layer can be spaced apart from the active region and insulating layer and lie along a first side of the first portion of the first layer, and the third portion of the first layer can be spaced apart from the active region and insulating layer and lie along a second side of the first portion of the first layer that is opposite the first side of the first portion of the first layer. The non-volatile memory cell can also include an interlevel dielectric layer, and a second layer including polysilicon. The interlevel dielectric layer can lie between the first layer and the second layer. The second layer can include a first portion, a second portion, and a third portion. The first portion of the second layer can overlie the first portion of the first layer, the gate dielectric layer, and the channel region within the active region, the second portion of the second layer can lie along a first side of the first portion of the second layer, and the third portion of the second layer can lie along a second side of the first portion of the second layer that is opposite the first side of the first portion of the second layer.

In one embodiment of the third aspect, from a plan view, the first layer can laterally surround the active region, and the second layer laterally surrounds the active region.

The term "active region" is intended to mean a conduction path for charge carriers within a transistor structure, wherein the conduction path can be sustained for a relatively long period of time. Within a transistor, the channel region, source region, drain region, or source/drain regions are part of the active region. A gate electrode, a control gate electrode, or a floating gate electrode is not part of the active region for that particular transistor. For the purposes of this specification, a tunneling or other charge injection path through one or more dielectric layers is not considered a conduction path because too much charge would accumulate within the dielectric layer (s) if the tunneling or other charge injection path would be sustained for a relatively long period of time.

The term "stack" is intended to mean a plurality of layers or a plurality of at least one layer and at least one structure (e.g., Nan crystals), wherein the plurality of layers or plurality of layer(s) and structure(s) provides an electronic function. For example, a non-volatile memory stack can include layers used to form at least part of a non-volatile memory cell. A stack may be part of a larger stack. For example, a non-volatile memory stack can include a charge storage stack that is used to store charge within a non-volatile memory cell.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or"

refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

FIGS. 1 to 14 illustrate views of various stages of a NVM cell formed in accordance with an embodiment of the present invention.

Figure 1:
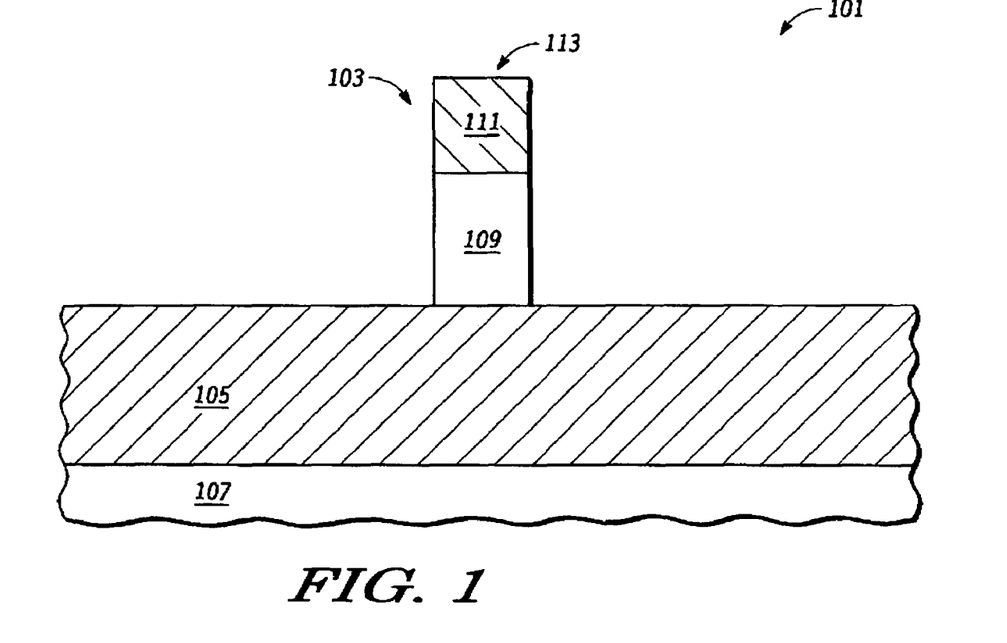
FIG. 1 includes an illustration of a cross-sectional view of a portion of a substrate after forming a vertical structure.

FIG. 1 includes an illustration of a cross-sectional view of a portion of a substrate 101 on which an NVM cell 103 is being formed. In the embodiment illustrated, the substrate 101 has a semiconductor-on-insulator (SOI) configuration with an insulating layer 105 (e.g., silicon dioxide) formed (e.g., thermally grown or deposited) over a base material 107 of, for example, bulk silicon. In other embodiments, substrate 101 may have other configurations including other SOI configurations, such as silicon-on-sapphire.

A vertical structure 113, including an active region 109 and an insulating structure 111, is formed by depositing a first layer of a substantially crystalline semiconductor material (e.g., silicon, silicon germanium, germanium, III-V semiconductor, or II-VI semiconductor) over the insulating layer 105 and a dielectric layer (e.g., nitride, oxide, or oxynitride) over the first layer. The first layer and dielectric layer are patterned to form the vertical structure 113 by a conventional lithographic technique. The vertical structure 113 is referred to as a fin structure. In another embodiment, the first layer, which used to form the active region 109, may be doped prior to forming active region 109. In another embodiment, active region 109 may be doped after patterning.

Figure 2:
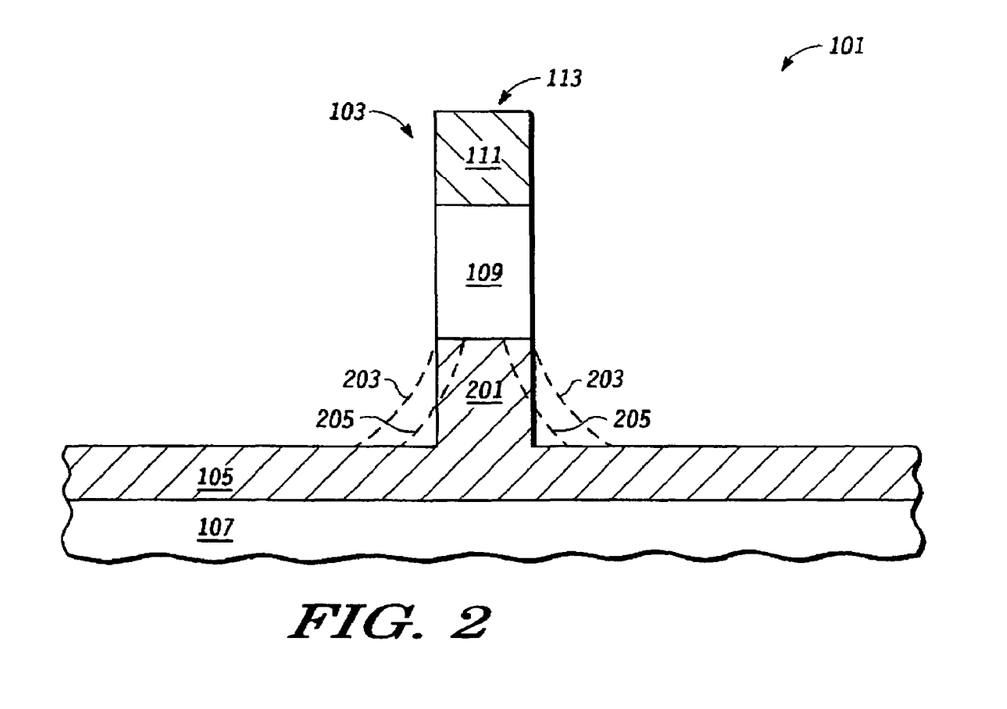
FIG. 2 includes an illustration of a cross-sectional view of the substrate of FIG. 1 after forming an insulating structure from a portion of an insulating layer.

FIG. 2 illustrates a cross-sectional view of the substrate 101 after an insulating structure 201 is formed by the removal of part of the insulating layer 105. In one embodiment, material from a top portion of the insulating layer 105 outside of vertical structure 113 is removed by dry etching to form the insulating structure 201 by reducing the thickness of layer 105 outside of vertical structure 113. The desired height of the insulating structure 201 may depend upon the thickness removed from the insulating layer 105. In a particular embodiment, the desired height is at least as high as the thickness of a subsequently-formed charge storage layer. In other embodiments, other processes for forming the insulating structure 201 may be used to remove part of the insulating layer 105 including using a wet etch of the insulating layer 105. In a particular embodiment of a wet etch, the active region 109 may be partially undercut. See, for example, structure profile 205, as illustrated in dashed lines in FIG. 2. With another embodiment, other types of etching processes may be utilized. Also, in some embodiments, some of those processes may provide a structure profile 203, as illustrated by dashed lines in FIG. 2. In these embodiments, the active region 109 and insulating structure 111 are used as hard masks during the etching to form the insulating structure 201. In other embodiments, a single patterning step may be used to etch any combination of or all of insulating structure 111, active region 109, and insulating structure 201, as illustrated in FIGS. 1 and 2.

In one embodiment, the insulating layer 105 is etched (e.g. a dry etch, a wet etch, or both) for a predetermined time to reduce the thickness of the insulating layer 105 at selected locations. In another embodiment, the insulating layer 105 comprises a plurality of films having different compositions. The etch may be performed to etch through one or more of the films and endpoint on a particular film within the insulating layer 105. An optional timed overetch may be performed to account for nonuniform etching across the substrate 101 surface.

The desired height for the insulating structure 201 can vary based on the NVM cell design or the needs or desires of the NVM cell fabricator. In a particular embodiment, the height of the insulating structure 201 is at least as high as the thickness of a subsequently-formed charge storage layer. In another embodiment, the insulating structure 201 has about the same height as the thickness of the active region 109 (vertical direction as illustrated in FIG. 2). In still another embodiment, the insulating structure 201 may have a greater or lesser height than the thickness of the active region 109. In yet another embodiment, the height of the insulating structure 201 can be up to ten times greater than the thickness of the active region 109. In some embodiments, the difference between the height of the insulating structure 201 and the thickness of the active region 109 depends upon the desired ratio between the capacitance of a subsequently-formed control gate electrode and a subsequently-formed charge storage layer to the capacitance between the subsequently-formed charge storage layer and the active region 109. Also in another embodiment, the difference between the height of the insulating structure 201 and the thickness of the active region 109 may also depend upon the desired drive current of NVM cell 103. In some embodiments, the height of the insulating structure 201 may be in the range of 5 to 200 nm, and the thickness of the active region 109 may be in the range of 2 to 200 nm. After reading this specification, skilled artisans will appreciate that other heights or thicknesses can be used in other embodiments.

Figure 3:
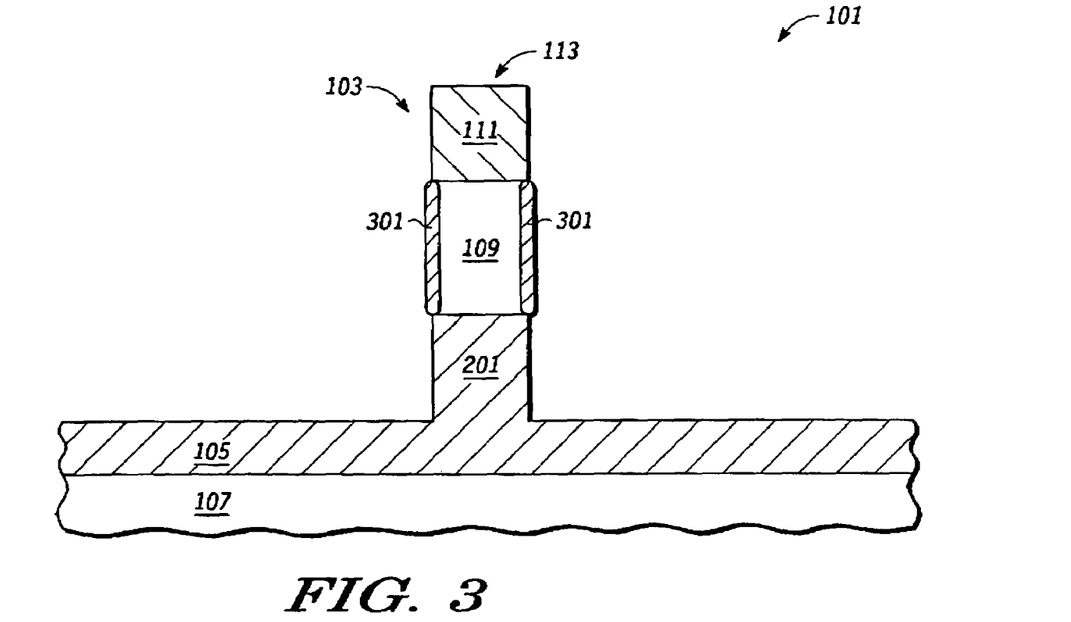
FIG. 3 includes an illustration of a cross-sectional view of the substrate of FIG. 2 after forming a gate dielectric layer.

FIG. 3 illustrates a cross-sectional view of the substrate 101 after forming a gate dielectric layer 301 along the exposed sidewalls of the active region 109. In the embodiment illustrated, the gate dielectric layer 301 can be formed by oxidizing the exposed sidewalls of active region 109. The oxidation can be performed at a temperature in the range of 700 to 1000° C. In another embodiment (not illustrated), a layer of dielectric material (e.g. $SiO_2$, $Si_3N_4$, $Si_aO_bN_c$, high-k material, or any combination thereof) may be deposited over the substrate 101 including on the side walls of active region 109. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. As used throughout this specification, the sum of the lettered subscripts for any specific compound is 1. In still another embodiment (not illustrated), the insulating structure 111 is removed prior to forming the gate dielectric layer 301, wherein the gate dielectric layer 301 is then formed on the exposed surfaces of the active region 109, including on top of the active region 109. In one embodiment, the NVM cell is programmed, erased, or both using Fowler-Nordheim tunneling, and therefore, the gate dielectric layer is a tunneling dielectric layer having a thickness in a range of 1 to 12 nm.

Figure 4:
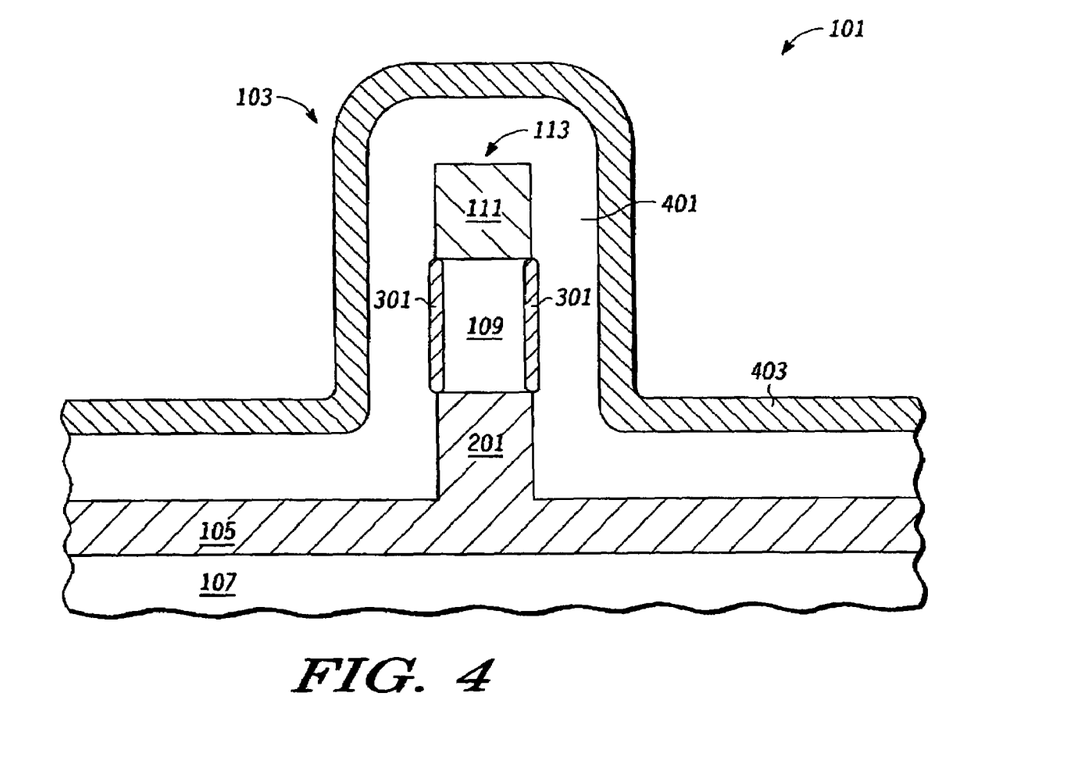
FIG. 4 includes an illustration of a cross-sectional view of the substrate of FIG. 3 after forming a charge storage layer and a spacer layer.

In FIG. 4, a charge storage layer 401 is deposited over the substrate 101. The charge storage layer 401 can include one or more semiconductor-containing or metal-containing films. In one embodiment, charge storage layer 401 includes polysilicon or amorphous silicon deposited by a chemical vapor deposition process, but may include other materials or may be deposited by other processes in other embodiments. In one embodiment, the charge storage layer 401 is doped as deposited, and in another embodiment, is doped after it is deposited. In one embodiment, the thickness of the charge storage layer 401 is in a range of 10-100 nm. In a particular embodiment, the charge storage layer 401 is a floating gate layer and includes a layer of polysilicon or amorphous silicon from which a floating gate electrode will be formed. In another embodiment, the charge storage layer 401 may include another type of material, such as silicon nitride, hafnium oxide, titanium dioxide, or other metal oxide. In an embodiment where the charge storage layer 401 includes hafnium or titanium, the gate dielectric layer 301 can be formed by an oxidation process after the deposition of the charge storage layer 401.

An insulating spacer layer 403 is deposited over the charge storage layer 401. The insulating spacer layer 403 includes a material that is different from the charge storage layer 401 to allow the insulating spacer layer 403 to be etched selectively compared to the charge storage layer 401. For example, if the charge storage layer 401 includes polysilicon or amorphous silicon, the insulating spacer layer 403 can include an oxide, a nitride, an oxynitride, or a carbon-containing materials, such as amorphous carbon. In an alternative embodiment, the insulating spacer layer 403 can include a metal-containing insulating material, (e.g., a metal oxide, a metal nitride, or a metal oxynitride). The thickness of the insulating spacer layer 403 will generally correspond to the width of subsequently-formed spacers, as measured at the base of the subsequently-formed spacers. In one embodiment, the thickness of the insulating spacer layer 403 is in a range of 10 to 100 nm. In another embodiment, the thickness of the insulating spacer layer 403 can be less than 10 nm or greater than 100 nm. In another embodiment, organic materials such as amorphous carbon may be used to form the spacer layer 403. This embodiment is most useful when sidewall spacers 603 and first capacitor electrodes 803 with a single, multistep etch process. Throughout this specification, different structures that are formed by etching using a single mask or no mask may be performed with a single, multistep process.

Figure 5:
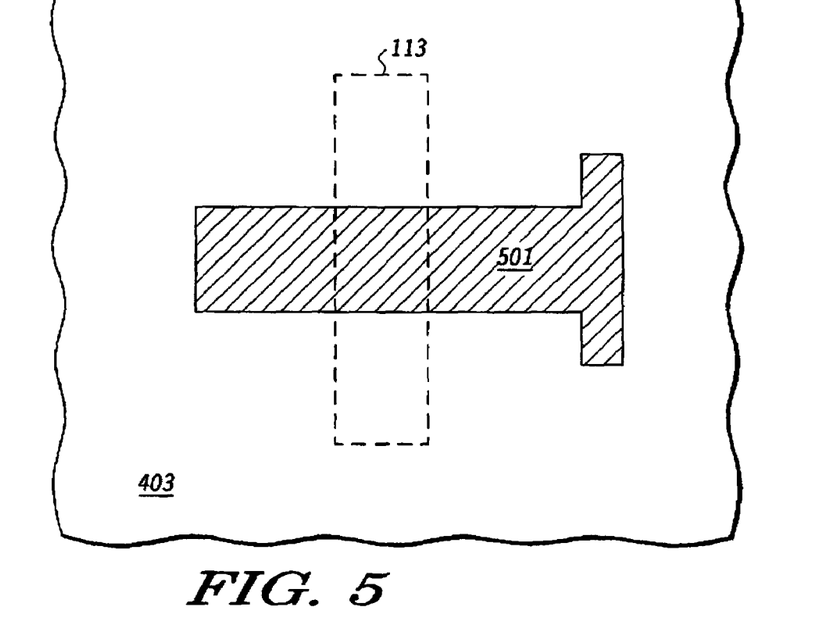
FIG. 5 includes an illustration of a plan view of the substrate of FIG. 4 after forming an etch mask over the spacer layer.

An etch mask 501 is formed over a portion of the insulating spacer layer 403 as illustrated in FIG. 5. The etch mask 501 can include a conventional resist material. The conventional resist material may be patterned using a conventional lithographic technique. The positional relationship of the etch mask 501 to the vertical structure 113, which includes the active region 109 and is illustrated as a dashed line, can be seen in FIG. 5. The portion of the etch mask 501 that overlies the vertical structure 113 generally corresponds to the channel region of the NVM cell being formed. The portions of the vertical structure 113 not covered by the etch mask 501 generally correspond to the source/drain regions of the NVM cell.

Figure 6:
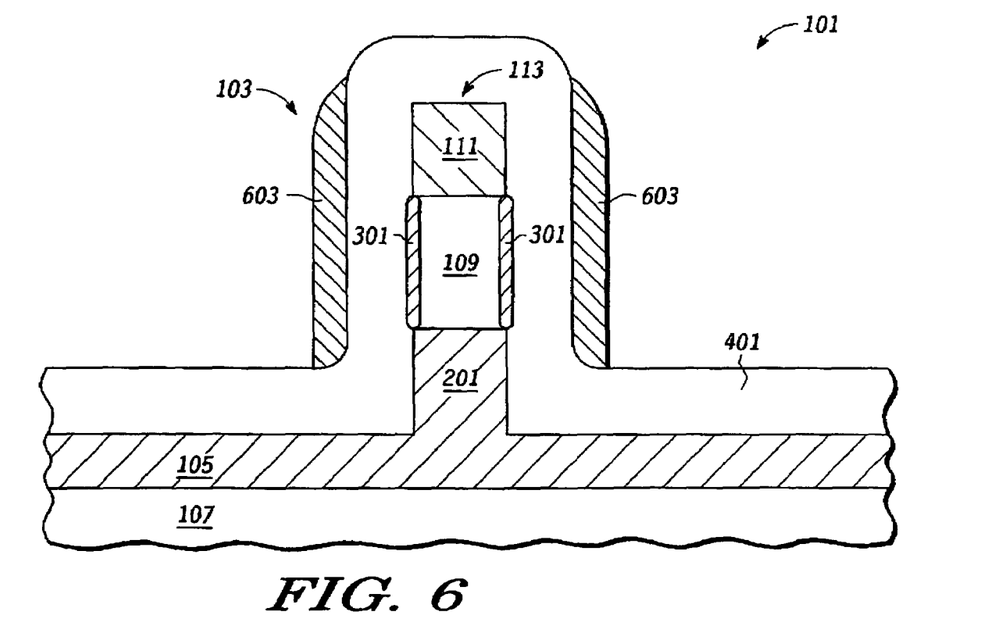
FIG. 6 includes an illustration of a cross-sectional view of the substrate of FIG. 5 after forming sidewall spacers.

An etch is performed to form sidewall spacers 603 as illustrated in FIG. 6. The etch is performed as an anisotropic etch and removes exposed portions of the insulating spacer layer 403. The portions of the insulating spacer layer 403 covered by the etch mask 501 or lying along vertical or near vertical surfaces near the vertical structure 113 remain after performing the etch. The etch is performed using one or more gasses that selectively etch the insulating spacer layer 403 compared to the charge storage layer 401. In one embodiment, insulating the insulating spacer layer 403 includes silicon nitride, and the charge storage layer 401 includes polysilicon or amorphous silicon. The etch chemistry is selected so that silicon nitride etches at a significantly faster rate as compared to polysilicon or amorphous silicon. A conventional etch chemistry can be used. The etch chemistry may be changed if the spacer layer includes an oxide or metal.

In one exemplary, non-limiting embodiment where the insulating spacer layer 403 includes silicon nitride that is selectively to polysilicon or amorphous silicon within the charge storage layer 401, a first etch portion uses $CF_4$ and HBr (or alternately $SF_6$ and HBr or other chemistries specifically tuned to the silicon nitride material composition) may be used to clear the main portion of insulating spacer layer 403 that lie along substantially horizontal surfaces. The first etch portion usually has lower etch selectivity to the underlying polysilicon or amorphous silicon within the charge storage layer 401 and is controllably ended through the use of a spectroscopic or interferometric endpoint. A second etch portion is them performed, where the etch chemistry more selective (etches silicon nitride faster relative to etching polysilicon or amorphous silicon) as compared to the first etch portion. The second etch portion is then used to clear the remaining portion of insulating spacer layer 403.

Either the first or second etch portions may add one or more $CH_xF_y$ gases, where $x+y=4$, to increase selectivity. Oxygen or similar chemistry may also be added to the etch to increase selectively of silicon nitride to any one or more of polysilicon, amorphous silicon, or silicon dioxide, but at the expense of selectivity to any carbon-containing layers, such as photoresist, that may be present. In another embodiment, the sidewall spacers 603 can include amorphous carbon and are formed prior to the use of the etch mask 501 to allow more selectivity to polysilicon or amorphous silicon, as compared to an embodiment where the sidewall spacers 603 include silicon nitride. After reading this specification, skilled artisans will be able to determine the etch chemistry to give an acceptable etch selectivity for their needs or desires.

Figure 7:
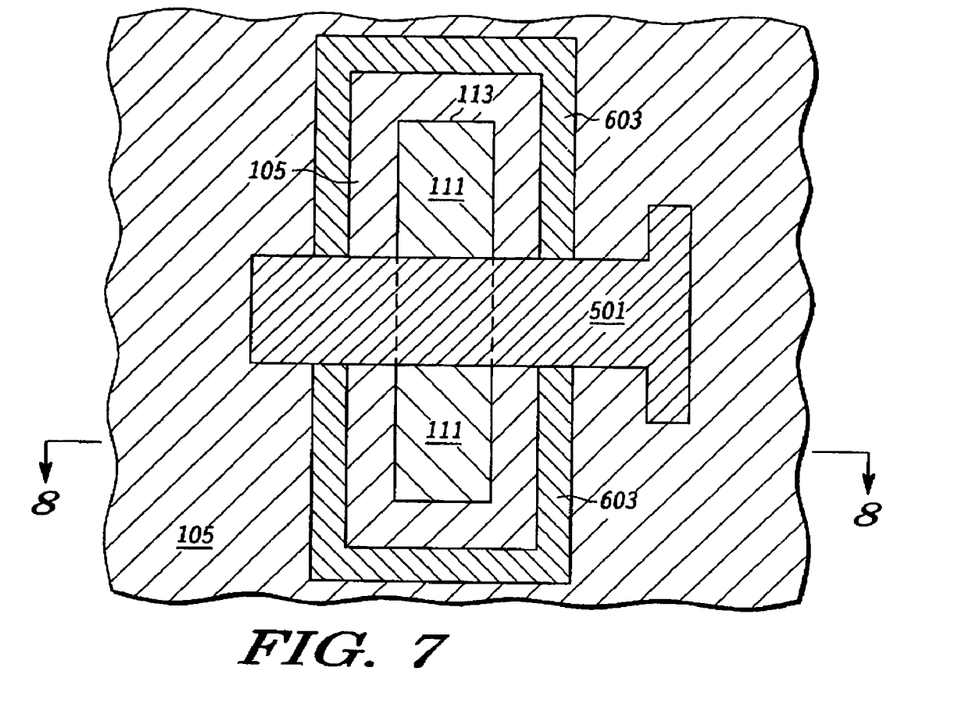
FIGS. 7 and 8 include illustrations of a plan view and a cross-sectional view, respectively, of the substrate of FIG. 6 after etching the charge storage layer.
Figure 8:
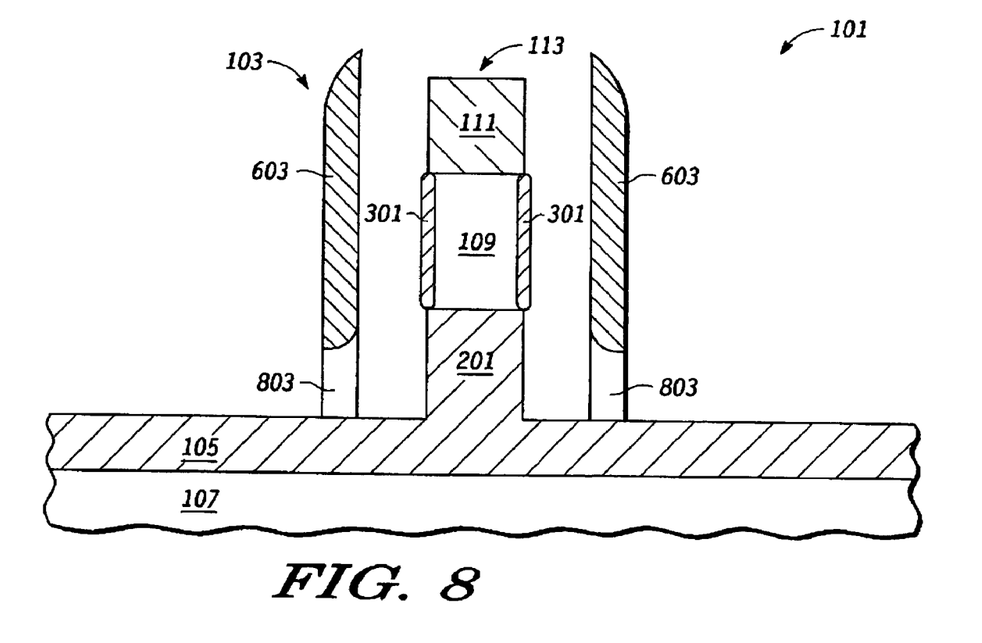

Another etch is performed to remove portions of the charge storage layer 401 that are not covered by the etch mask 501 or sidewall spacers 603, as illustrated in FIGS. 7 and 8. The second etch is performed as an anisotropic etch. Portions of the insulating layer 105 and the insulating structure 111 within the vertical structure 113 becomes exposed. The portions of the charge storage layer 401 covered by the etch mask 501 or sidewall spacers 603 remain after performing the second etch. The portion of the charge storage layer 401 underlying the etch mask 501 is a floating gate electrode 801, and portions of the charge storage layer 401 underlying the sidewall spacers 603 form first capacitor electrodes 803 for the capacitor portions of the capacitor structure being formed.

The etch is performed using one or more gasses that selectively etch the charge storage layer 401 compared to the insulating structure 111, sidewall spacers 603, and insulating layer 105. In one embodiment, the charge storage layer 401 includes polysilicon or amorphous silicon, the insulating structure 111 and sidewall spacers 603 include silicon nitride, and the insulating layer 105 includes silicon dioxide. The etch chemistry is selected so that the material within the charge storage layer 401 etches at a significantly faster rate as compared to the etch rates of each of silicon nitride and silicon dioxide. A conventional etch chemistry, such as those used to form polysilicon gate electrodes, can be used.

In one exemplary, non-limiting embodiment, a first etch portion is used to breakthrough any remaining insulating spacer layer 403, native oxides on the charge storage layer 401, or any combination thereof. In one embodiment, $CF_4$ and Ar used. In another embodiment, HBr and $Cl_2$ may be used to reduce etching of the sidewall spacers 603, although the chemistry may be tuned to reduce the likelihood micromasking of the polysilicon or amorphous silicon of the charge storage layer 401 during the latter etch portion or portions. Next, a second or main etch portion is used to remove the main portion of charge storage layer 401 using conventional silicon etch chemistries, such as $Cl_2$ and HBr. $CF_4$ and oxygen may be added to further control the etch. The main etch portion may be timed or endpoint controlled. To reduce loss of the now exposed gate dielectric layer 301 or an insulating layer 105, a more selective to oxide etch portion or portions are used after the main etch portions. In one embodiment, this a third etch portion, called a softlanding portion, is used reduce the likelihood that the main etch portion will directly engage the underlying and soon to be exposed underlying layers. In one embodiment, an overetch etch portion is used to remove any remaining undesired portions of charge storage layer 401. In one embodiment, the softlanding and overreach portions use HBr and oxygen to achieve high selectivity to the underlying materials. In another embodiment, $Cl_2$ or similar chemistry is added, often in small amounts, to assist in forming the desired profile for desirable portions for charge storage layer 401. In one embodiment, the softlanding, overarch portion or both are endpoint controlled. In other embodiment, a series of overreach portions can be used to control the desired profiles of first capacitor electrodes 803. The etch portions can use a series of different gas flows, pressures, radio-frequency power settings, or any combination thereof to achieve the desired results. After reading this specification, skilled artisans will be able to determine the etch chemistry to give an acceptable etch selectivity for their needs or desires.

The etch mask 501 can be removed at this time. If the etch mask 501 includes an organic material, the etch mask 501 can be removed using a conventional ashing technique. In another embodiment the etch mask 501 may be removed after the sidewall spacers 603 are removed, as described below.

Still another etch is performed to the sidewall spacers 603 and portions of the insulating structure 111 not covered by the charge storage layer 401. The etch can be performed as an isotropic etch. In one embodiment, a $H_3PO_4$ solution can be used to selectively remove the sidewall spacers 603 and exposed portions of the insulating structure 111 when the sidewall spacers 603 and the insulating structure 111 include silicon nitride. If the sidewall spacers 603 include silicon dioxide, an HF solution can be used to selectively remove the sidewall spacers 603 from the first capacitor electrode 803 of the capacitor portions. Care may be used to remove the sidewall spacers 603 without removing too much of the insulating layer 105 if they include an oxide. In one specific embodiment, the insulating layer 105 may be substantially undone silicon dioxide, and the sidewall spacers 603 may include phosphorus-doped (at least 4 weight percent phosphorus) silicate glass ("PSG"). The PSG etches at a significantly higher rate in an HF solution compared to the undoped silicon dioxide.

In an alternative embodiment, the insulating structure 111 has a different composition compared to the sidewall spacers 603. For example, the insulating structure 111 can include silicon dioxide, and the sidewall spacers 603 can include silicon nitride. The etch can be performed as an anisotropic or isotropic etch. The etch chemistry is selected so that silicon nitride within the sidewall spacers 603 etch at a significantly faster rate as compared to the silicon dioxide within the insulating layer 105, the insulating structure 111, and the first capacitor electrodes 803. The portions of insulating structure 111 not covered by the charge storage layer 401 can remain or may be removed during yet another etch later in the process (e.g., after patterning a control gate layer).

If the etch mask 501 has not been removed, it is removed before processing the substrate 101 through any subsequent thermal (i.e., furnace or anneal) cycles. After reading this specification, skilled artisans will appreciate that options are available regarding the selection of materials, order of performing actions during the processing sequence, whether some structures may be removed or left in the finished NVM cell, or any combination thereof. After reading this specification, skilled artisans will be able to determine the etch chemistry to give an acceptable etch selectivity for their needs or desires.

Figure 9:
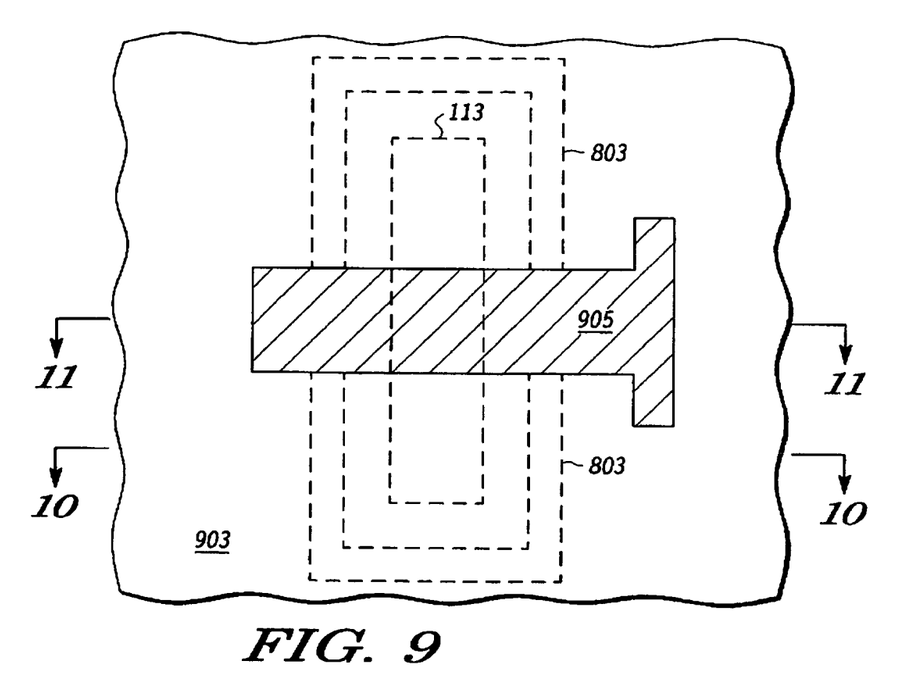
FIGS. 9 to 11 include illustrations of a plan view and cross-sectional views of the substrate of FIGS. 7 and 8 after forming an interlevel dielectric layer, a control gate layer, and an etch mask.
Figure 10:
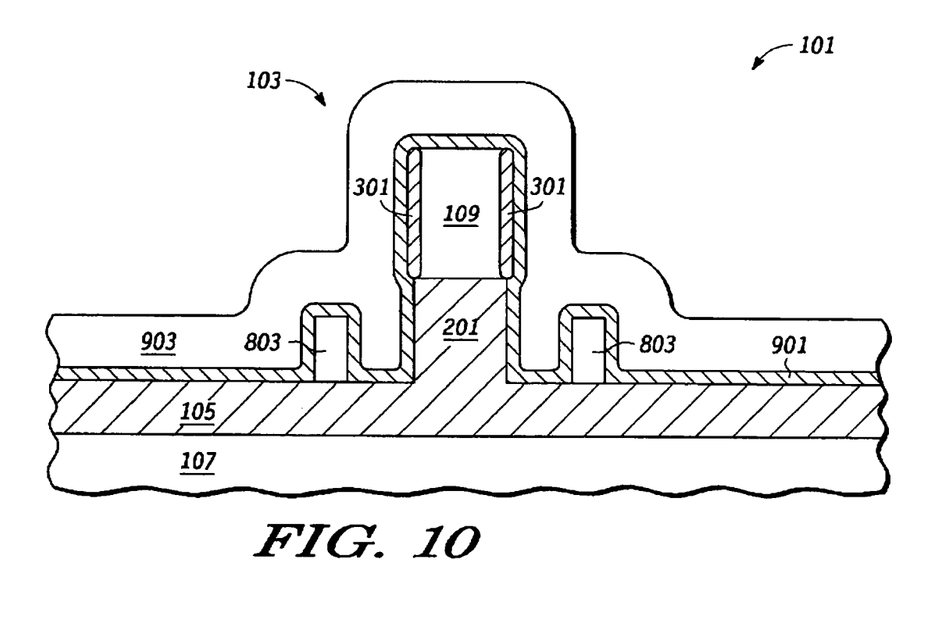
Figure 11:
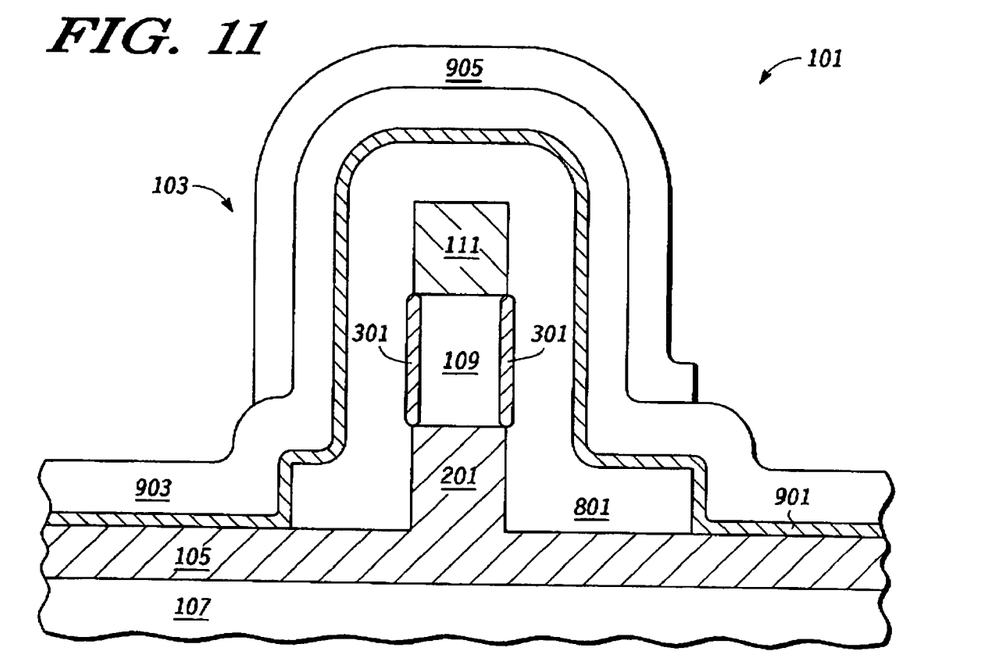

Referring to FIGS. 9 to 11, an interlevel dielectric layer 901, a control gate layer 903, and an etch mask 905 are sequentially formed over the substrate 101. The interlevel dielectric layer 901 can include silicon dioxide, silicon ox nitride, an oxide-nitride-oxide stack, or a high-k dielectric material, such as any one or more high-k materials previously described, or any combination thereof. In one embodiment, the interlevel dielectric layer 901 is formed by a conventional deposition technique (e.g., chemical of physical vapor deposition). In an alternative embodiment, where the charge storage layer 401 includes a metal, such as hafnium or titanium, the interlevel dielectric layer 901 can be formed by oxidizing part of the charge storage layer 401. In one embodiment, the thickness of the interlevel dielectric layer 901 is in a range of 1 to 20 nm. The control gate layer 903 can include one or more semiconductor-containing or metal-containing films that are deposited over the interlevel dielectric layer 901. In one embodiment, control gate layer 903 includes polysilicon or amorphous silicon deposited by a chemical vapor deposition process, but may include other materials or may be deposited by other processes in other embodiments. In one embodiment, the control gate layer 601 is doped as deposited, and in another embodiment, is doped after it is deposited. In one embodiment, the thickness of the control gate layer 903 is in a range of 50-1000 nm.

An etch mask 905 is formed using a conventional lithographic technique. In one embodiment, the etch mask 905 includes an organic material. FIG. 9 includes a plan view that illustrates the positional relationships between the etch mask 905, which corresponds to the shape of the control gate electrode, and underlying portions of the vertical structure 113 and the first electrodes 803 of the capacitor portions. FIGS. 10 and 11 include cross-sectional views corresponding to sectioning lines 10-10 and 11-11, respectively, at this point in the process.

An etch is performed to remove portions of the control gate layer 903. The etch is performed as an anisotropic etch and selectively removes the control gate layer 903 compared to the interlevel dielectric layer 901. In one embodiment, the control gate layer 903 includes polysilicon or an amorphous silicon, and the uppermost surface of the interlevel dielectric layer 901 includes silicon dioxide, silicon nitride, or silicon oxynitride. A conventional etch chemistry can be used. The control gate layer 903 may be etched using any one or more of the embodiments as previously described with respect to the charge storage layer 401. In another embodiment, the breakthrough portion or portions may need to be extended to address the increased topography of the structure being formed. The interlevel dielectric layer 901 may be etched or may remain within an NVM array of the electronic device. The interlevel dielectric layer 901 is significantly thinner that the control gate layer 903 and the underlying insulating layer 105. Thus, removing exposed portions of the interlevel dielectric layer 901 is relatively easy as compared to the control gate layer 903 The etch mask 905 is removed after the etch step is completed. In one embodiment, a conventional ashing technique is used to remove the etch mask 905.

Figure 12:
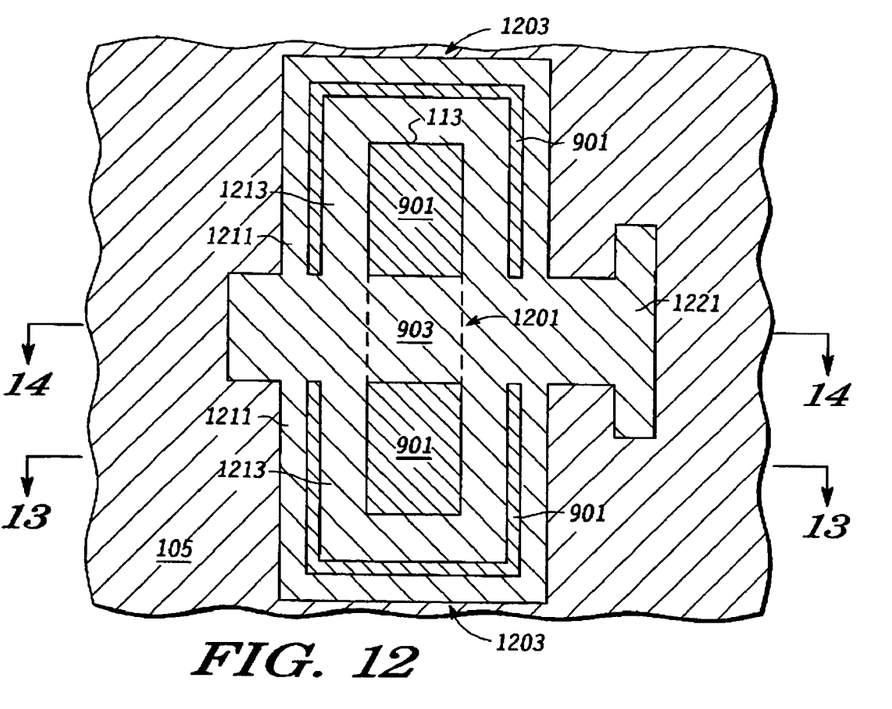
FIGS. 12 to 14 include illustrations of a plan view and cross-sectional views of the substrate of FIGS. 9 to 11 after forming etching portions of the control gate layer, and removing the etch mask.
Figure 13:
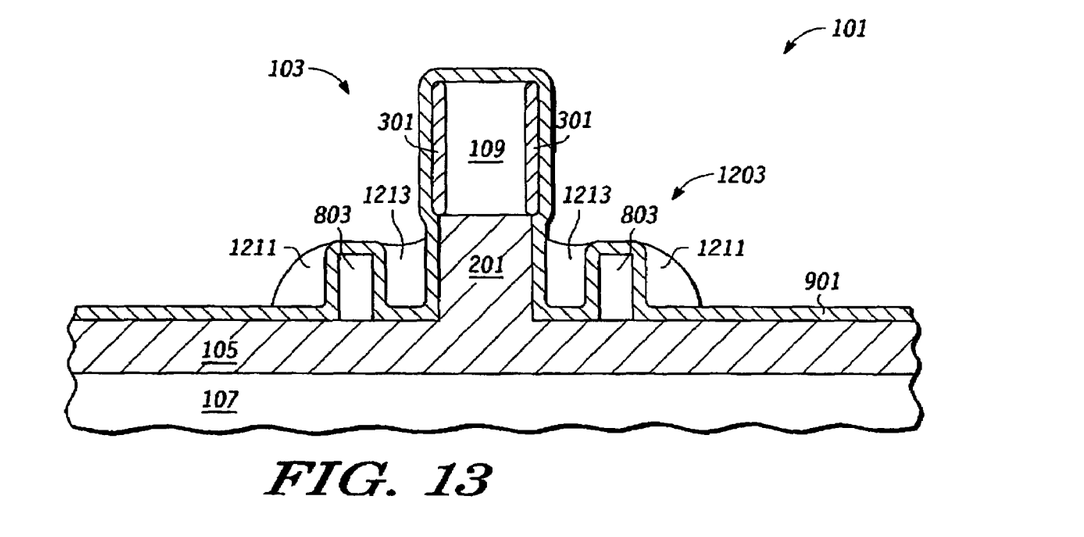
Figure 14:
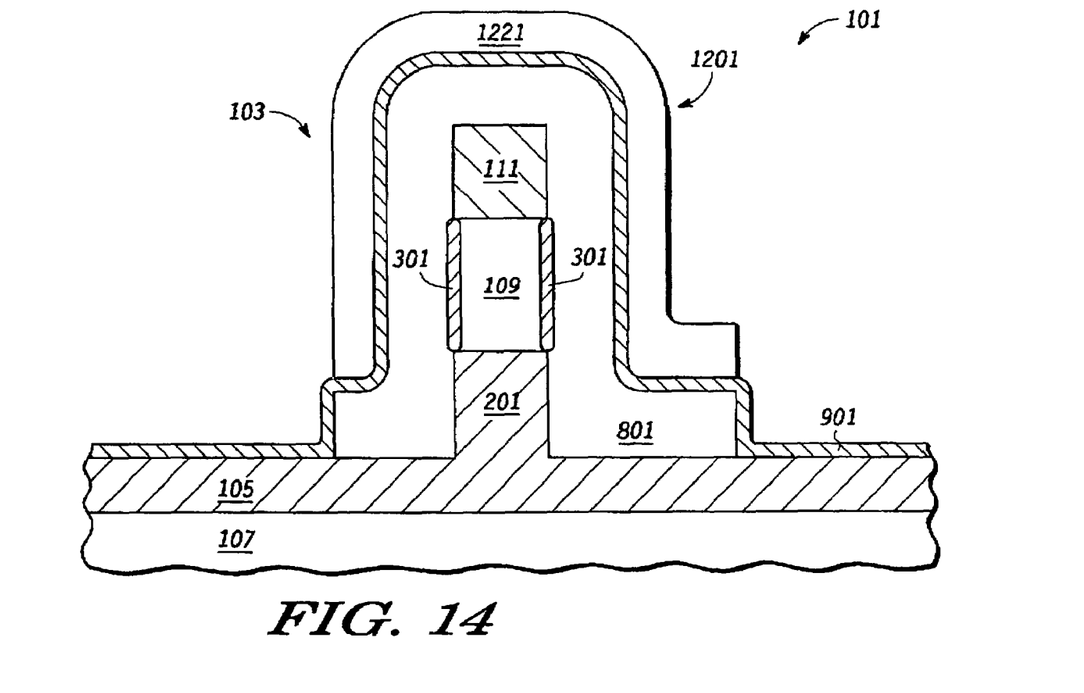

FIG. 12 includes a plan view at this point in the process. FIGS. 13 and 14 are cross-sectional views at sectioning lines 13-13 and 14-14, respectively. At this point in the process, the insulating layer 105, and portions of the interlevel dielectric layer 901 are exposed. A gate structure 1201 and capacitor portions 1203 are formed, each of which includes portions of the charge storage layer 401 and control gate layer 903.

The portions of the charge storage layer 401, interlevel dielectric layer 901, and control gate layer 903 that are laterally adjacent to the insulating structure 201 and over the insulating layer 105 form the capacitor structure, which from a plan view of the NVM cell, laterally surrounds the active region 109. The capacitor structure includes two capacitor portions 1203 that are substantially U-shaped as seen from a plan view in FIG. 12. Referring to FIG. 13, the first capacitor electrodes 803 for the capacitor portions 1203 include portions of the charge storage layer 401. The interlevel dielectric layer 901 lies laterally adjacent to and over the first capacitor electrodes 803. Second capacitor electrodes 1211 for the capacitor portions 1203 include portions of the control gate layer 401 and lie further from the insulating structure 201 compared to the first electrodes 803. Third capacitor electrodes 1213 for the capacitor portions 1203 include other portions of the control gate layer 401 and lie between the insulating structure 201 and the first electrodes 803. In one embodiment, the second and third electrodes 1211 and 1213 are electrically connected to one another.

The portion of the charge storage layer 401 lying laterally adjacent to and over the active region 109 is the floating gate electrode 801 for the NVM cell. The portion of the control gate layer 903 lying laterally adjacent to and over the active region 109 is a control gate electrode 1221 for the NVM cell. The floating gate electrode 801 and first capacitor electrodes 803 are formed from the charge storage layer 401, and therefore, the floating gate electrode 801 and the first capacitor electrodes 803 are electrically connected to one another. The control gate electrode 1221 and the second and third capacitors electrodes 1211 and 1213 are formed from the control gate layer 903, and therefore, the control gate electrode 1221 and the second and third capacitor electrodes 1211 and 1213 are electrically connected to one another. In addition to the capacitor portions 1203, the capacitor structure includes portions of the floating gate electrode 801 and control gate electrode 1221 that are adjacent to the capacitor portions 1203 and spaced apart from the active region 109. Referring to FIG. 12, such portions of the floating gate electrode 801 and control gate electrode 1221 lie between the capacitor portions 1203.

A doping operation is performed to heavily dope the portions of the active region 109 that are not covered by the gate structure 1201. In one embodiment, NVM cell 103 is a p-channel transistor with source/drain regions doped with a p-type material (e.g. boron). In another embodiment, NVM cell 103 is an n-channel transistor with source/drain regions doped with an n-type material (e.g. arsenic, phosphorus, or antimony). In a particular embodiment, the doped portions include an n-type dopant having a concentration of at least 1E19 atoms/cm$^3$. A thermal cycle can be performed to activate the dopant and form the source/drain regions. The portion of the active region 109 under the gate structure 1201 and between the source/drain regions is a channel region.

Additional processing is performed to form a substantially completed electronic device. The substantially completed electronic device can include additional patterned insulating layers, conductive layers, and passivation or encapsulating layers. Conductors formed from the conductive layers can include bit lines, words lines, and other interconnects to connect the NVM cell 103, as illustrated, with other NVM cells, substantially identical to the one illustrated, and electronic components (e.g., transistors, capacitors, resistors, etc.), and power and signal lines outside of the NVM memory array. Such processing is conventional to skilled artisans. Afterwards, the substrate 101 is simulated to form individual integrated circuits, each including multiple NVM cells similar to the NVM cell 103.

In an alternative embodiment, formation of the control gate layer 903 can be formed using a self-planarizing deposition or a post-deposition planarization sequence. Such planarization can be useful in providing less topography changes and helps when forming the mask 905 before patterning the control gate layer 903. Regarding self-planarization, as the thickness of the control gate layer 903 get thicker, the uppermost exposed surface of the control gate layer 903 becomes flatter. For a post-deposition planarization, the control gate layer 903 may be deposited, such that locations between the vertical structures 113 is completely filled. A conventional chemical-mechanical polishing step may be used to panelize the surface and remove some of the control gate layer 903 overlying the vertical structures 113. After reading this specification, skilled artisans will be able to determine whether planarization of the control gate layer 903 is to be performed and what type of planarization process is to be used for their particular needs or desires.

In still another alternative embodiment, the sidewall spacers 603 may be formed before forming the mask 503. The insulating spacer layer 403 may be formed and anisotropically etched. The mask 503 can be formed over portions of the charge storage layer 401 and sidewall spacers 603. The process following formation of the mask 503 is substantially the same except that the sidewall spacers 603 have been formed.

In one embodiment, the NVM cell 103 is implemented in a nonvolatile memory as a memory cell to store at least one bit by selectively inducing a charge in the charge storage layer 401. In another embodiment, the NVM cell 103 may be configured to store two bits. In one embodiment, the NVM cell 103 is implemented in a flash memory. In one embodiment, the NVM cell 103 is implemented in a NOR flash memory. In another embodiment, the NVM cell 103 is implemented in a NAND flash memory.

In the embodiment illustrated, the capacitance between the charge storage layer 401 and control gate layer 903 ($C_{FC}$) is significantly higher because the capacitor structure laterally surrounds the active region 109 as seen by a plan view of the NVM cell 103. Also, the capacitor structure includes capacitor portions 1203 that include first electrodes 803 that are coupled to the second and third electrodes 1211 and 1213, which lie on opposite sides of the first electrodes. Additionally, the capacitive coupling between the first electrodes 803

(within the capacitor portions 1203) and the active region 109 is insignificant. In one embodiment, the highest point of the capacitor portions 1203 lies at an elevation below the lowest point of the active region 109. For the purposes of this specification, elevations are measured in a vertical direction from the interface between the base material 107 and the insulating layer 105. In the same embodiment, none of the capacitor portions 1203 overlies the active region 109.

In one embodiment, $C_{FS}+C_{FB}+C_{FD}$ does not significantly increase. Therefore, a higher coupling ratio can be achieved. In one embodiment, the coupling ratio of at least 0.75 can be achieved when the height of active region 109 is 90 nm, structures 111 and 201 and first capacitor electrodes 803 are each 75 nm in height. In a particular embodiment, the coupling ratio is at least 0.9.

As the coupling ratio increases, the voltage on the charge storage layer 401 (floating gate electrode 801 and first electrodes 803) more closely follows the voltage applied to the control gate layer 903 (control gate electrode 1221 and second and third electrodes 1211 and 1213) due to increased capacitive coupling. In one embodiment, the higher capacitive coupling may result in a reduction voltage between the charge storage layer 401 and active region 109 (any one or more of source/drain regions or the channel region) during Fowler-Nordheim programming or erasing. This may improve the charge exchange between the active region 109 and the charge storage layer 401 which may, in some embodiments, provide for a smaller program or erase voltage, a small erase or program time, a bigger memory window defined as the difference between the threshold voltages for the programmed and erased states, or any combination thereof.

Also, in one embodiment, implementing an NVM cell 103 with the insulating structure 201 may reduce the charge storage layer (e.g., floating gate electrode) to charge storage layer 401 (e.g., floating gate electrode) coupling between adjacent NVM cells, and thus, provide for increased memory density. The charge storage layer-to-charge storage layer coupling between adjacent NVM cells can limit density of NAND memories.

Still another advantage with the embodiment illustrated is that the higher coupling ratio can be achieved with little or no increase in the area occupied by the NVM cell. Therefore, valuable substrate area is not used for a significantly larger NVM cell.

Yet a further advantage with the embodiment illustrated is that the capacitor portions 1203 can be formed without adding any additional masking layers. Fewer masking layers reduce production costs and increase yield due to less processing. The fabrication of the NVM cell 103 can be performed using conventional materials.

Many different embodiments are possible. Layers that are deposited may be deposited using chemical vapor deposition, physical vapor deposition, or a combination thereof. The chemical vapor depositing may or may not be plasma enhanced and may or may not use a metalorganic material. Physical vapor deposition can include evaporation or sputtering. Sputtering can be performed using magnetron sputtering or an inductively coupled plasma.

In another embodiment, an NVM cell similar to the NVM cell 103 may be made on a bulk semiconductor wafer, wherein the under lying semiconductor material is oxidized or etched out and backfilled with an insulating layer to leave islands of semiconductor material.

In still another embodiment, one or more anti-reflective layers (not illustrated) may be formed over the charge storage layer 401 before forming the etch mask 501, over the control gate layer 901 before forming the etch mask 903, or both. The anti-reflective layers can help in patterning the etch mask 501, 901, or both. The anti-reflective layer can include a nitride, such as silicon-rich silicon nitride, a metal-containing nitride, a metal-silicon nitride, an oxynitride of any of the foregoing, or a combination thereof. The anti-reflective layer can be removed after the corresponding etch mask is removed or may remain over the charge storage layer 401, the control gate layer 901, or both.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above disclosed subject matter is to be considered illustrative, and not restrictive, and the appended claims are intended to cover all such modifications, enhancements, and other embodiments which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming a non-volatile memory cell comprising:

forming an active region over a substrate;

forming a first layer over the active region, wherein the first layer comprises a charge storage layer;

forming a second layer over the first layer, wherein the second layer has a different composition compared to the first layer;

forming a first etch mask over the second layer, wherein exposed portions of the first and second layers overlie the active region and are not covered by the first etch mask;

etching part of the exposed portion of the second layer;

etching part of the exposed portion of the first layer to leave a residual portion including a floating gate electrode and first capacitor electrodes, wherein the floating gate electrode overlies the active region, and the first capacitor electrodes are adjacent to opposite sides of the floating gate electrode;

removing the first etch mask;

forming a dielectric layer over the residual portion of the first layer; and forming a control gate electrode over the dielectric layer, wherein, from a top view in a finished device, a combination of the floating gate electrode and first capacitor electrodes laterally surrounds all sides of the active region.

2. The process of claim 1, wherein a portion of the first layer covered by the first etch mask corresponds to the floating gate electrode for the non-volatile memory cell, and another portion of the first layer not covered by the first etch mask corresponds to the first capacitor electrodes.

3. The process of claim 1, wherein etching part of the exposed portion of the second layer forms a sidewall spacer lying adjacent to the first layer.

4. The process of claim 3, wherein after etching part of the exposed portion of the first layer, only portions of the first layer covered by the first etch mask and sidewall spacer lie within the non-volatile memory cell.

5. The process of claim 1, wherein etching part of the exposed portion of the first layer is performed such that the first capacitor electrodes include distal portions spaced away from the floating gate electrode, wherein uppermost surfaces of the distal portions lie at elevations lower than a lowermost surface of the active region.

6. The process of claim 1, further comprising forming second and third capacitor electrodes, wherein from a top view, the first capacitor electrodes lie between the second and third capacitor electrodes.

7. The process of claim 6, wherein forming die control gate electrode and forming the second and third capacitor electrodes comprise:
    forming a third layer over the dielectric layer; and
    etching the third layer to form the control gate electrode and the second and third capacitor electrodes.

8. The process of claim 6, wherein etching part of the exposed portion of the first layer is performed such that the floating gate electrode and the first capacitor electrodes are electrically connected to one another.

9. The process of claim 8, wherein forming the first layer, etching part of the exposed portion of the first layer, forming the dielectric layer, forming the control gate electrode, and forming the second and third capacitor electrodes are performed to form a capacitor structure including a first capacitor structure electrode and a second capacitor structure electrode, wherein the first capacitor structure electrode includes the floating gate electrode and the first capacitor electrodes, and the second electrode includes the control gate electrode and the second and third capacitor electrodes.

10. A process of forming a non-volatile memory cell comprising:
    forming an insulating layer over a substrate;
    forming an active region over the insulating layer, wherein sides of the active region and a portion of the insulating layer are substantially coterminous with each other;
    forming a gate dielectric layer lying along the active region;
    forming a first layer comprising polysilicon;
    etching the first layer to define a first portion, a second portion, and a third portion, wherein;
        the first portion of the first layer overlies the gate dielectric layer and a channel region within the active region;
        the second portion of the first layer is spaced apart from the active region and insulating layer and lies adjacent to a first side of the first portion of the first layer;
        the third portion of the first layer is spaced apart from the active region and insulating layer and lies adjacent to a second side of the first portion of the first layer that is opposite the first side of the first portion of the first layer; and
        from a top view, a combination of the first, second, and third portions of the first layer laterally surrounds all sides of the active region;
    forming an interlevel dielectric layer after forming the first layer;
    forming a second layer including polysilicon after forming the interlevel dielectric layer; and
    etching the second layer to define a first portion, a second portion, and a third portion, wherein:
        the first portion of the second layer overlies the first portion of the first layer, the gate dielectric layer, and the channel region within the active region;
        the second portion of the second layer lies along a first side of the first portion of the second layer;
        the third portion of the second layer lies along a second side of the first portion of the second layer that is opposite the first side of the first portion of the second layer;
        from a top view, a part of the second portion of the second layer lies between the active region and the second portion of the first layer;
        from a top view, a part of the third portion of the second layer lies between the active region and the third portion of the first layer; and
        from a top view, a combination of the first, second, and third portions of the second layer laterally surrounds all sides of the active region and laterally surrounds the second and third portions of the first layer.

11. The process of claim 10, wherein etching the first layer is performed such that, from a top view, a combination of the first, second, and third portions of the first layer laterally surrounds the active region.

12. The process of claim 10, wherein:
    etching the first layer is performed such that a floating gate electrode includes the first portion of the first layer; and
    etching the second layer is performed such that a control gate electrode includes the first portion of the second layer.

13. The process of claim 12, wherein:
    etching the first layer is performed such that the first, second, and third portions of the first layer are electrically connected to one another; and
    etching the second layer is performed such that the first, second, and third portions of the second layer are electrically connected to one another.

14. The process of claim 13, wherein forming the first layer, etching the first layer, forming the interlevel dielectric, forming the second layer, and etching the second layer are performed to form a capacitor structure including a first electrode and a second electrode, wherein the first electrode includes the first, second, and third portions of the first layer; and the second electrode includes the first, second, and third portions of the second layer.

15. The process of claim 10, wherein etching the first layer is performed such that the second and third portions of the first layer lie at elevations lower than the active region.

16. A process of forming a non-volatile memory cell comprising:
    forming an active region over a substrate;
    forming a first layer over the active region, wherein the first layer comprises a charge storage layer;
    forming a second layer over the first layer, wherein the second layer has a different composition compared to the first layer;
    etching the second layer to form sidewall spacers;
    forming a first etch mask over the first layer, wherein exposed portions of the first layer overlie the active region and are not covered by the first etch mask;
    etching part of the exposed portion of the first layer to leave a residual portion including a floating gate electrode and first capacitor electrodes, wherein the first capacitor electrodes lie at elevations lower than the active region;

removing the first etch mask;

forming a dielectric layer over the residual portion of the first layer; and forming a control gate electrode over the dielectric layer, wherein in a finished device, the first capacitor electrodes extend from the opposite sides of the floating gate electrode in directions substantially parallel to a length of the active region.

17. The process of claim 16, further comprising forming second and third capacitor electrodes, wherein from a top view, the first capacitor electrodes lie between the second and third capacitor electrodes.

18. The process of claim 17, wherein:

forming the first layer and etching part of the exposed portion of the first layer is performed such that, from a top view, a combination of the floating gate electrode and the first capacitor electrodes laterally surrounds the active region; and forming the control gate electrode and forming the second and third capacitor electrodes are performed such that, from a top view, a combination of the control gate electrode and the second and third capacitor electrodes laterally surrounds the active region.

19. The process of claim 17, wherein forming the control gate electrode and forming the second and third capacitor electrodes comprise:

forming a third layer over the dielectric layer; and etching the third layer to form the control gate electrode and the second and third capacitor electrodes.

20. The process of claim 19, wherein:

etching part of the exposed portion of the first layer is performed such that the floating gate electrode and the first capacitor electrodes are electrically connected to one another; and forming the control gate electrode and forming the second and third capacitor electrodes is performed such that the control gate electrode and the second and third capacitor electrodes are electrically connected to one another.

* * * * *